United States Patent
Ruby et al.

(10) Patent No.: US 6,507,983 B1
(45) Date of Patent: Jan. 21, 2003

(54) METHOD OF MAKING TUNABLE THIN FILM ACOUSTIC RESONATORS

(75) Inventors: Richard C. Ruby, Menlo Park, CA (US); Paul Philip Merchant, Belmont, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 571 days.

(21) Appl. No.: 09/192,163

(22) Filed: Nov. 13, 1998

Related U.S. Application Data (62) Division of application No. 08/703,716, filed on Aug. 27, 1996, now Pat. No. 5,873,153, which is a division of application No. 08/171,227, filed on Dec. 21, 1993, now Pat. No. 5,587,620.

(51) Int. Cl.[7] .............................................. H04R 17/00
(52) U.S. Cl. ...................................... 29/25.35; 427/100
(58) Field of Search .................. 29/25.35; 427/100; 310/324, 328, 331, 332

(56) References Cited

U.S. PATENT DOCUMENTS

| 4,320,365 A | * | 3/1982 | Black et al. | ................. 333/187 |
| 4,456,850 A | * | 6/1984 | Inoue et al. | ................. 310/324 |

* cited by examiner

*Primary Examiner*—A. Dexter Tugbang (57) ABSTRACT

An acoustical resonator comprising top and bottom electrodes that sandwich a PZ layer. The resonance frequency of the acoustical resonator may be adjusted after fabrication by utilizing heating elements included in the acoustical resonator and/or by adjusting the thickness of a tuning layer. In the preferred embodiment of the present invention, the electrodes comprise Mo layers. One embodiment of the present invention is constructed on a $Si_3N_4$ membrane. A second embodiment of the present invention is constructed such that it is suspended over a substrate on metallic columns. In the preferred embodiment, the electrodes are deposited by a method that minimizes the stress in the electrodes.

2 Claims, 6 Drawing Sheets

METHOD OF MAKING TUNABLE THIN FILM ACOUSTIC RESONATORS

This is a divisional of application Ser. No. 08/703,716 filed on Aug. 27, 1996, now issued as U.S. Pat. No. 5,873,153 which is a Division of Ser. No. 08/171,277 filed Dec. 21, 1992, now U.S. Pat. No. 5,587,620.

FIELD OF THE INVENTION

The present invention relates to acoustic resonators, and more particularly, to resonators that may be used as filters for electronic circuits.

BACKGROUND OF THE INVENTION

The need to reduce the cost and size of electronic equipment has led to a continuing need for ever smaller filter elements. Consumer electronics such as cellular telephones and miniature radios place severe limitations on both the size and cost of the components contained therein. Many such devices utilize filters that must be tuned to precise frequencies. Hence, there has been a continuing effort to provide inexpensive, compact filter units.

One class of filter element that has the potential for meeting these needs is constructed from acoustic resonators. These devices use bulk longitudinal acoustic waves in thin film piezoelectric (PZ) material. In one simple configuration, a layer of PZ material is sandwiched between two metal electrodes. The sandwich structure is suspended in air by supporting it around the perimeter. When an electric field is created between the two electrodes via an impressed voltage, the PZ material converts some of the electrical energy into mechanical energy in the form of sound waves. The sound waves propagate in the same direction as the electric field and reflect off of the electrode/air interface.

At the mechanical resonance, the device appears to be an electronic resonator; hence, the device can act as a filter. The mechanical resonant frequency is that for which the half wavelength of the sound waves propagating in the device is equal to the total thickness of the device for a given phase velocity of sound in the material. Since the velocity of sound is many orders of magnitude smaller than the velocity of light, the resulting resonator can be quite compact. Resonators for applications in the GHz range may be constructed with physical dimensions less than 100 $\mu$m in diameter and few $\mu$m in thickness.

Prior art resonators have suffered from a number of problems. The first problem is the inability to tune the resonator without lowering the Q of the resonator. As noted above, the resonant frequency is determined by the thickness of the resonator. The thickness of the PZ film is fixed at fabrication; hence, the resultant resonance frequency is also fixed. Since there are variations in thickness from device to device resulting from manufacturing tolerances, some method for adjusting the resonance frequency of each device is needed.

Several methods have been suggested for altering the resonance frequency after the device has been constructed. For example, a varactor diode can be connected in series with the resonator. The varactor is then turned to change the resonance frequency of the series combination. Unfortunately, varactor diodes have inherently low Q values which, in turn, reduce the Q value of the resonator varactor combination.

A second problem with prior art resonators lies in the materials used to construct the electrodes. The acoustic path is determined by the distances between the outer edges of the electrodes, i.e., the electrode/air interface. Hence, the sound waves must pass through the electrodes as well as the PZ material. As a result, the acoustic properties of the electrodes become important. In addition, the ease of fabrication of the device must also be taken into account, since the devices are fabricated by methods that are similar to those used in semiconductor device fabrication.

The most common electrode materials are aluminum and gold. These materials are preferred because of the ease of integration of the materials into the fabrication process. Aluminum metalization is commonly used in semiconductor fabrication processes; hence, its methodology is well understood. In addition, aluminum is less expensive and outperforms gold from an acoustic point of view.

Aluminum has two disadvantages. First, it is difficult to selectively etch aluminum. Selective etching is less of a concern in semiconductor fabrication than in resonator fabrication, since the aluminum is usually deposited on materials which are compatible with previously known selective etch processes. In resonator fabrication, the electrode layers are preferably created by etching. Second, aluminum has relatively high thermal elastic losses. These losses reduce the performance of the resonator.

Broadly, it is the object of the present invention to provide an improved thin film acoustic resonator.

It is a further object of the present invention to provide an acoustic resonator that may be tuned after fabrication.

It is a still further object of the present invention to provide an acoustic resonator with electrodes constructed from materials having superior properties than the prior art aluminum electrodes.

These and other objects of the preseat invention will become apparent to those skilled in the art from the following detailed, description of the invention and the accompanying drawings.

SUMMARY OF THE INVENTION

The present invention comprises an acoustical resonator comprising top and bottom electrodes that sandwich a PZ layer. The resonance frequency of the acoustical resonator may be adjusted after fabrication by utilizing heating elements included in the acoustical resonator and/or by adjusting the thickness of a tuning layer. In the preferred embodiment of the present invention, the electrodes comprise Mo layers. One embodiment of the present invention is constructed on a $Si_3N_4$ membrane, thus forming a composite resonator where the acoustic path includes a non-piezoelectric medium. A second embodiment of the present invention is constructed such that it is suspended over a substrate on metallic columns. In the preferred embodiment of the present invention, the electrodes are deposited by a method that minimizes the stress in the electrodes and the piezoelectric layer.

DETAILED DESCRIPTION OF THE INVENTION

Figure 1:
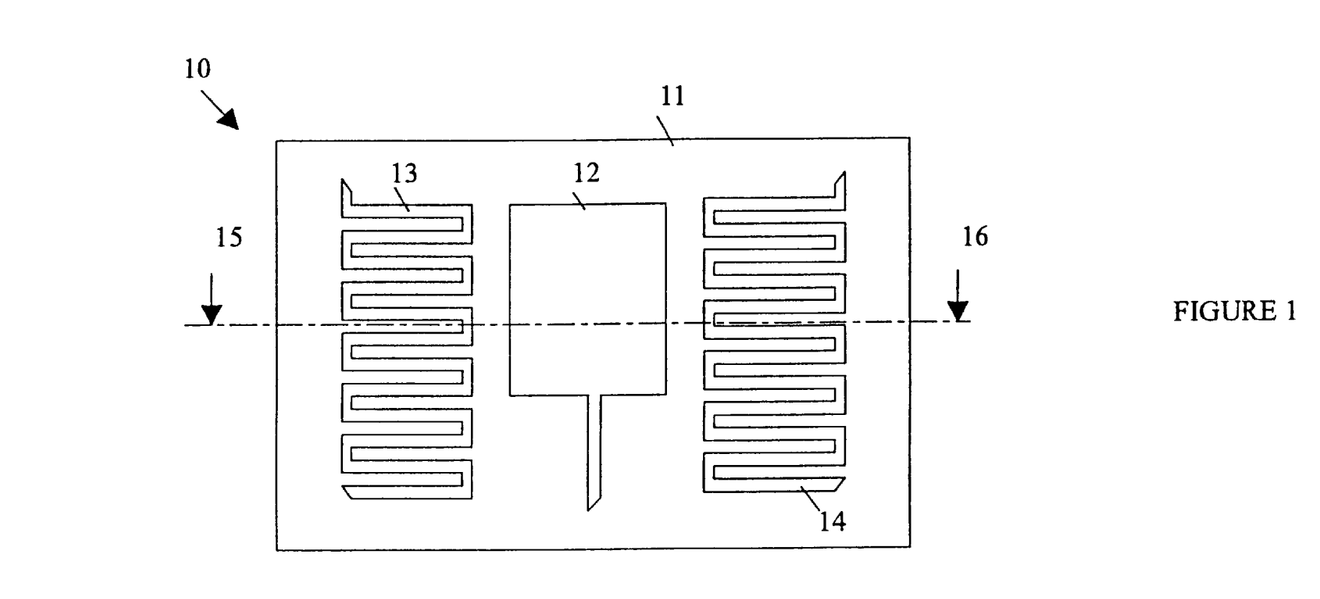
FIG. 1 is bottom view of a film bulk acoustic resonator according to the present invention.
Figure 2:
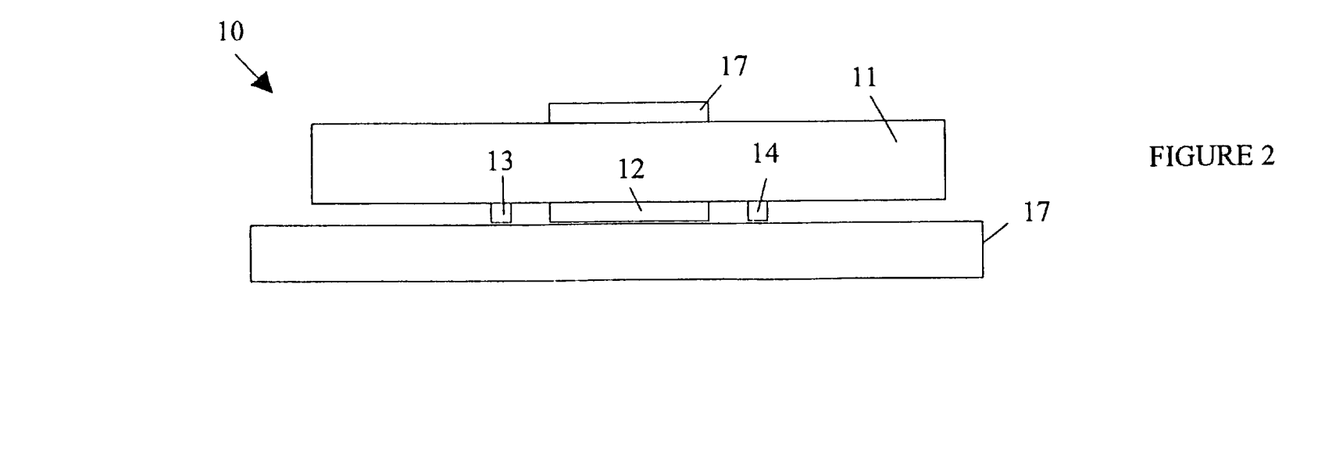
FIG. 2 is a cross-sectional view of the film bulk acoustic resonator shown in FIG. 1.

In one embodiment of the present invention, the frequency of the resonator is shifted by heating the resonator to adjust the resonance frequency to the desired frequency, hence, compensating for frequency errors arising from the finite manufacturing tolerances. Refer now to FIGS. 1 and 2. FIG. 1 is bottom view of a film bulk acoustic resonator (FBAR) 10 according to the present invention, and FIG. 2 is a cross-sectional view of FBAR 10 through line 15–16. FBAR 10 includes bottom and top electrodes 12 and 17, respectively, which sandwich a portion of sheet of PZ material 11. As will be explained in more detail below, FBAR 10 is constructed on a thin membrane 17. The temperature of the PZ material is controlled by resistive heating elements 13 and 14.

The preferred PZ material is aluminum nitride, AlN. The electrodes and heating elements used in resonator 10 will be assumed to be made from aluminum; however, embodiments employing other materials will be discussed in more detail below. For composite AlN resonators, it is found experimentally that frequency of the resonance has a thermal coefficient of frequency shift in the range of 0 to 200 ppm. Hence, by altering the temperature of the FBAR over a rage of 200° C., a frequency shift of 4% may be obtained. Since the resonator structure has a very small thermal mass, the temperature tuning is essentially instantaneous.

The heating elements can act both as resistive heaters and temperature sensors. The change in resistivity of aluminum with temperature is between 0.3% and 0.4% per ° C. Hence, by measuring the current flowing in one or both of the heating elements, one can ascertain the temperature of the FBAR. The correct temperature for any given device and operating frequency can be determined by tests at the time of manufacture.

Figure 3:
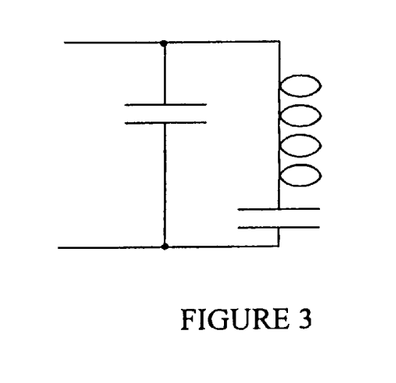
FIG. 3 is a schematic diagram of an electrical circuit that is equivalent to a film bulk acoustic resonator.
Figure 4:
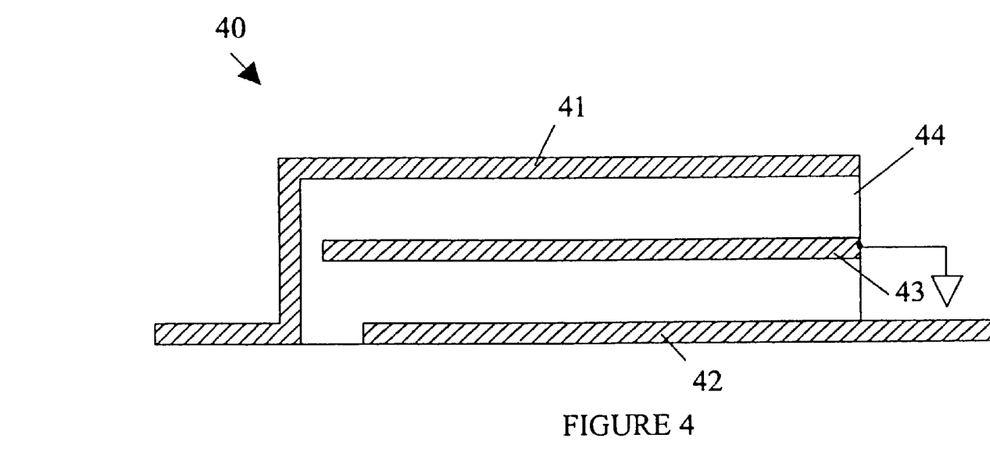
FIG. 4 is a cross-sectional view of a stacked bulk acoustic resonator.
Figure 5:
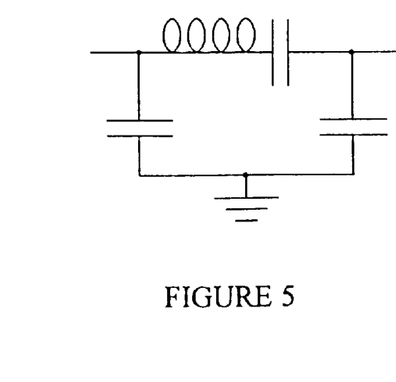
FIG. 5 is a schematic diagram of an electrical circuit that is equivalent to a stacked bulk acoustic resonator.

An FBAR is electrically equivalent to the tank circuit shown in FIG. 3. A cross-sectional view of an alternative resonator design, referred to as a stacked bulk acoustic resonator (SBAR) is shown in FIG. 4 at 40. SBAR 40 is a three terminal device having electrodes 41–43 which are separated by PZ material 44. The electrical equivalent circuit for SBAR 40 shown in FIG. 5.

The preferred PZ material for both SBAR and FBAR resonators is AlN. However, ZnO and lead zirconate titantate (PZT) may also be used. In general, the PZ material should have good thermal conductivity; however, the conductivity should not be so high as to cause significant heat loss. The preferred materials have a reasonably high electromechanical coupling constant and low dielectric constant.

Ideally the PZ layer would be epitaxial. This would minimize dispersive losses in the acoustic signal propagation through the layer. Unfortunately, epitaxial layers are not economically feasible with present technology. Satisfactory performance can be obtained, however, as long as the PZ layer is highly ordered. In the preferred embodiment of the present invention, the PZ layer is columnar in nature, consisting of domains that extend from the:bottom electrode to the top electrode. Each domain is a single crystal; hence, dispersive losses at the grain boundaries are minimized.

The nature of the PZ layer is determined by the bottom electrode and the film growth conditions. The bottom electrode must be an ordered structure. As will be discussed in more detail below, the preferred embodiment of the present invention uses Mo electrodes. The AlN layer is preferably deposited on the bottom electrode by a sputtering process. The parameters of the sputtering system are adjusted to provide columnar growth of the AlN layer.

It is important to note that the electrodes are part of the acoustic path. Hence, the material from which the electrodes are constructed is also important in determining the properties of the filter. Prior art FBAR and SBAR devices are constructed using gold or aluminum electrodes. These electrodes materials are preferred in the prior art because of the extensive technology that has been developed to deposit these materials during conventional integrated circuit fabrication.

The preferred embodiment of the present invention utilizes Mo, Ti, or W for the electrodes because of the low thermo-elastic losses of these materials. For example, Mo has approximately 56 times less thermo-elastic loss than Al. The use of these materials in the past has been hampered by the ability to make low stress layers of these materials. As will be explained in more detail below, the deposition method of the present invention overcomes these difficulties.

Figures 6, 7:
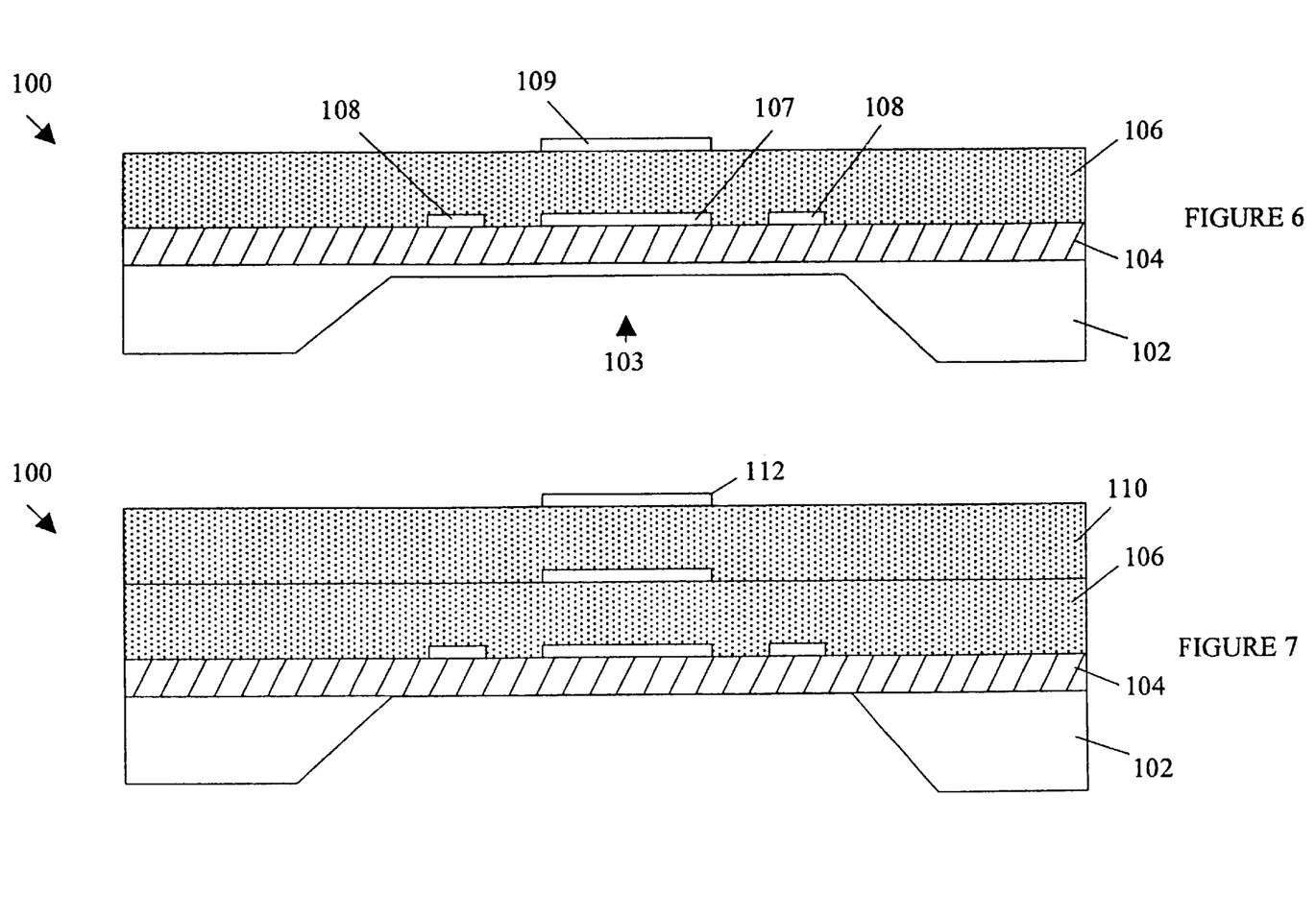
FIGS. 6 and 7 are cross-sectional views of a stacked bulk acoustic resonator at different stages in the fabrication process.

Refer now to FIGS. 6 and 7 which are cross-sectional views of an SBAR 100 at different stages in the fabrication process. SBAR 100 is preferably constructed on a silicon wafer 102 on which a $Si_3N_4$ layer 104 has been deposited. After deposition of layer 104, the back side of wafer 102 is etched to form a cavity 103. In the preferred embodiment of the present invention, the etching is carried out in two steps. In the first step, approximately 80% of the silicon is removed with a KOH etch which is a strong base etchant. This operation will be referred to as pre-slotting in the following discussion. The amount of material removed is chosen such that the wafer is not materially weakened by the removal of the material, and hence, no special precautions are required in the handling of the pre-slotted wafers during the subsequent processing. The remainder of the silicon is removed in a second step described below.

After etching cavity 103, the metalization for the bottom electrode 107 and the heaters 108 is deposited on the surface of $Si_3N_4$ layer 104. A layer of AlN 106 is then deposited over the heaters and bottom electrode. A second electrode 109 is then deposited on the surface of layer 106. Next, a second layer of AlN 110 is deposited and the third electrode 112 deposited on top,of layer 110. If an FBAR were being fabricated instead of an SBAR, layer 110 and electrode 112 would be omitted.

After completing the fabrication of the top electrode 112, the remainder of the silicon in cavity 103 is removed by a slow etching process that is more easily controlled than the KOH described above. In the preferred embodiment of the present invention, the remaining silicon is removed using a tetra-methyl-ammonium hydroxide (TMAH) etching solution. In contrast to strong base etchants, the TMAH, properly doped with silicon ions, will not attack Al, AlN, or oxides. TMAH is, however, a much slower acting etchant than KOH. For this reason, the wafer was pre-slotted as described above. The removal of the remaining silicon leaves the SBAR suspended on a $Si_3N_4$ membrane. In the preferred embodiment of the present invention, the $Si_3N_4$ membrane is typically between $0.2\mu$ to $1 \mu$.

Figure 8:
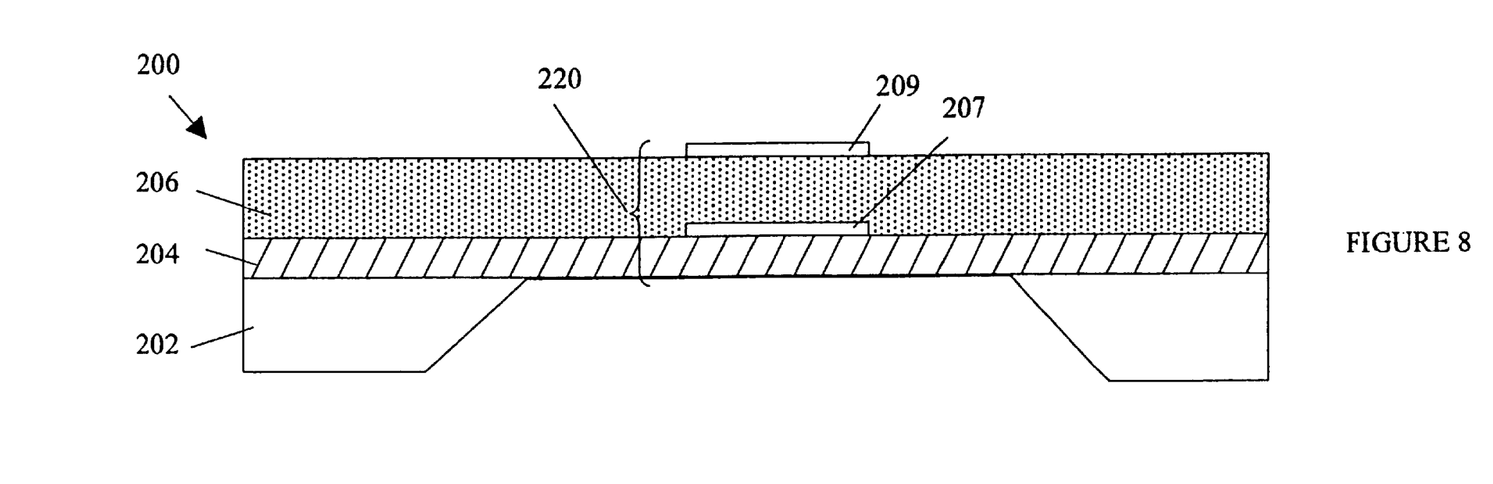
FIG. 8 is a cross-sectional view of another embodiment of a film bulk acoustic resonator according to the present invention.

The resonance frequency of an FBAR or SBAR is among other things, determined by the acoustic path between the two air interfaces on each side of the device. Refer now to FIG. 8 which is a cross-sectional view of a FBAR 200. FBAR 200 is constructed from a PZ layer 206 that is sandwiched between electrodes 207 and 209. FBAR 200 is constructed on a $Si_3N_4$ layer 204 which was deposited on a silicon substrate 202 as described above. The resonance frequency of FBAR 200 is determined by the length of the acoustic path 220 between the air interface on the top side of electrode 209 and the air interface on the bottom side of $Si_3N_4$ layer 204.

The accuracy with which acoustic path 220 may be fixed depends on the precision with which the thicknesses of the various layers are controlled during the fabrication process. It would be advantageous to be able to adjust acoustic path 220 after fabrication to correct for any errors in the fabrication process. The present invention provides two methods for accomplishing this adjustment.

Figure 9:
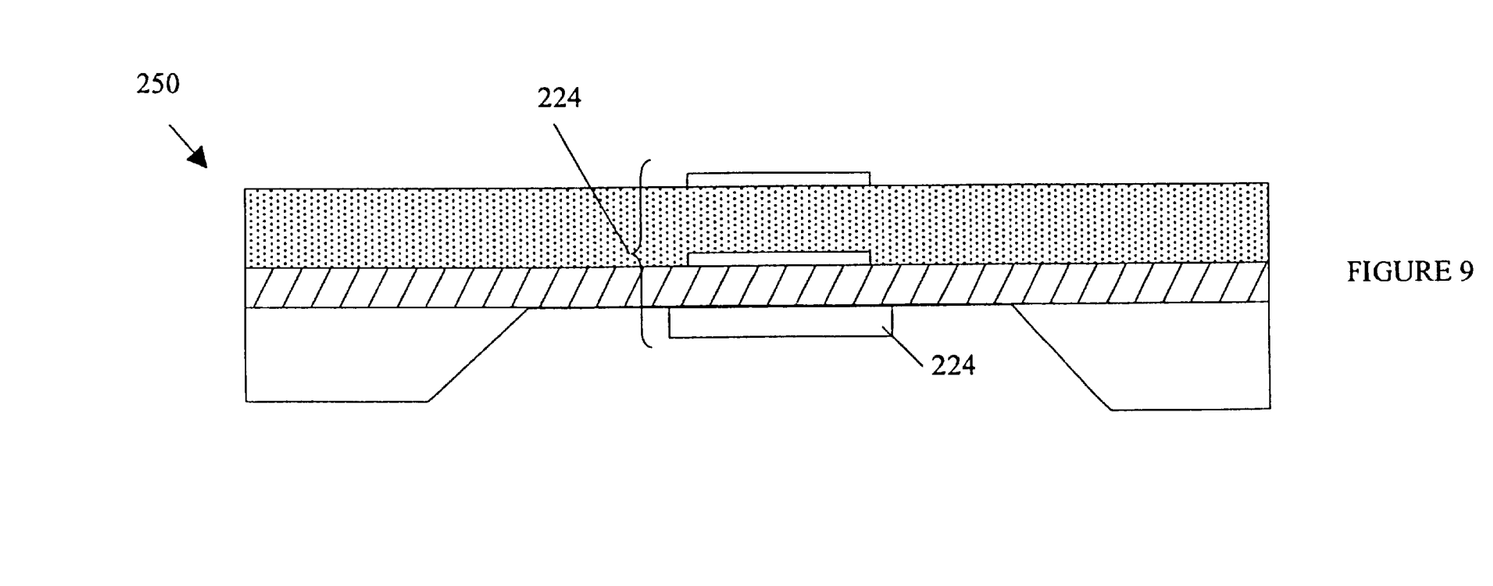
FIG. 9 is a cross-sectional view of yet another embodiment of a film bulk acoustic resonator according to the present invention.

The first method is illustrated in FIG. 9 which is a cross-sectional view of an FBAR 250 having an additional layer 224 on the underside of the $Si_3N_4$ layer. In the presence of layer 224, the acoustical path is increased as shown at 224. In the preferred embodiment of the present invention, layer 224 is a conductor with a resistivity that is sufficiently high to allow layer 224 or a portion thereof to be evaporated by passing a current through layer 224. As the thickness of layer 224 is changed, the resonance frequency of FBAR 250 will increase. Hence, in this embodiment of the present invention, the fabrication parameters are chosen such that FBAR 250 has a resonance frequency which is slightly below the desired frequency, In post fabrication testing, the frequency is measured and material from layer 224 is evaporated until the frequency increases to the desired value.

In the preferred embodiment of the present invention, layer 224 is constructed from Mo. However, other materials will be apparent to those skilled in the art. For example, layer 224 may be constructed from Al, W, Au, Pt, or Ti.

Figure 10:
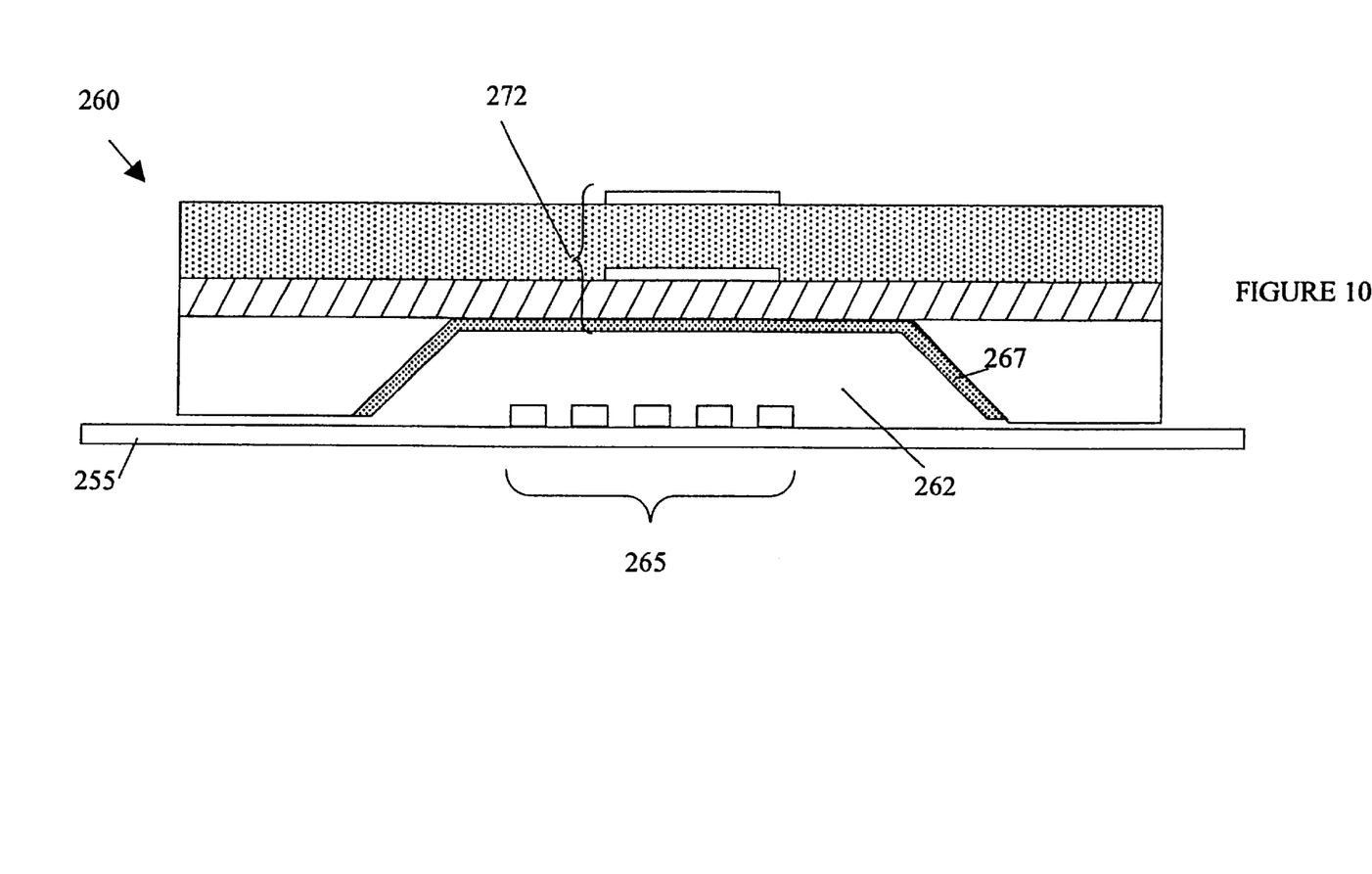
FIG. 10 is a cross-sectional view of another embodiment of a film bulk acoustic resonator according to the present invention.

An alternative method for adjusting the acoustical path, and hence, the resonance frequency of an SBAR or FBAR according to the present invention is illustrated in FIG. 10 which is a cross-sectional view of an FBAR 260. FBAR 260 is fabricated as described above and then mounted on a surface 255 which includes a plurality of metal "fuse" elements 265 which, are positioned so as to be inside cavity 262. By passing current through one of the fuse elements, the metal of the fuse element evaporates and is deposited on the inside of cavity 262. This results in a film 267 which increases the thickness of the acoustic path 272. Once again, tests of the device after fabrication are used to determine the amount of material that is to be evaporated from elements 265. Fuse elements 265 can be constructed from the same material as used for layer 224 discussed above.

It should be noted that the methods for tuning of the resonance frequency discussed with respect to FIGS. 9 and 10 may be applied to a conventional SBAR or FBAR or to an FBAR or SBAR having heating elements such as discussed above with reference to FIGS. 6 and 7.

The above-described embodiments of the present invention were constructed by depositing the various layers on a silicon wafer and then etching the backside of the wafer to form a thin membrane on which the FBAR or SBAR was suspended. While this method of construction is satisfactory for devices having only SBAR or FBAR elements, it does not lend itself to construction of FBAR or SBAR elements on wafers having other circuitry.

Figure 11:
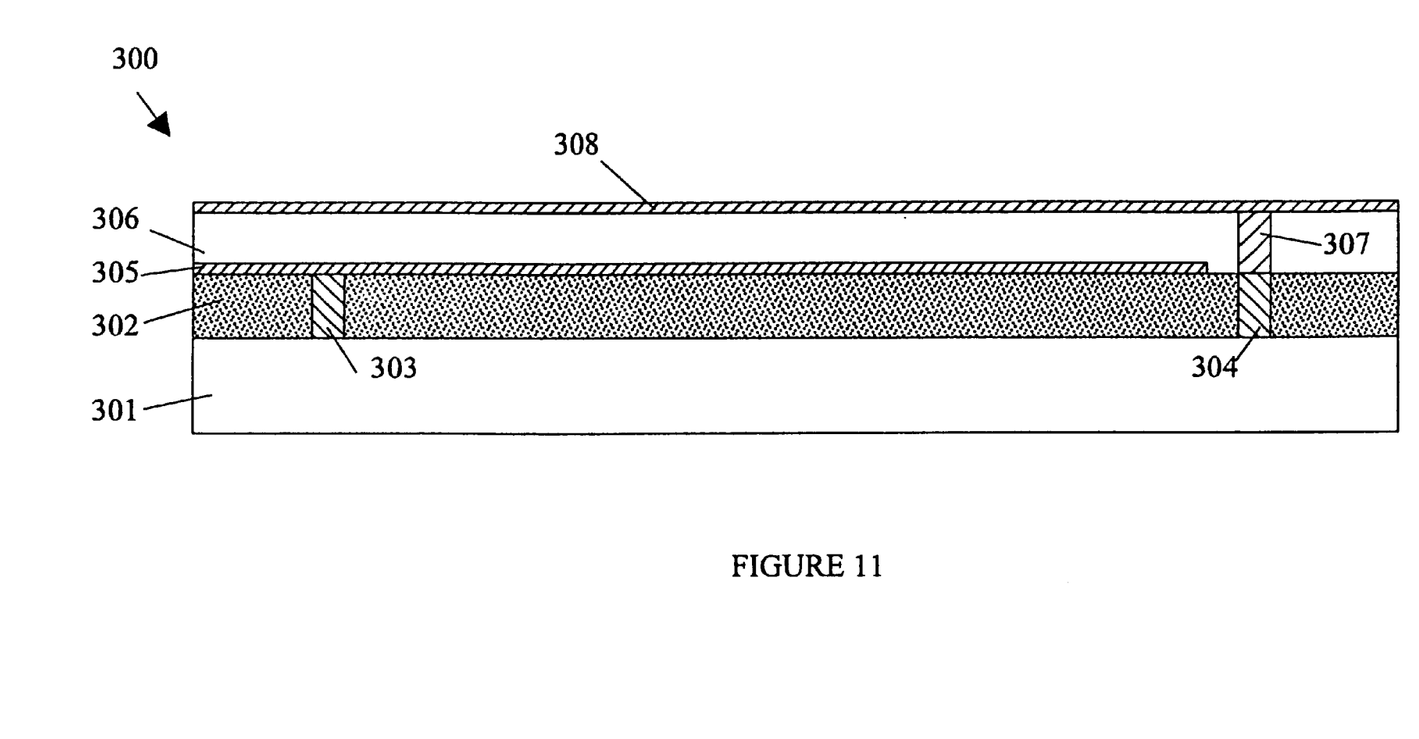
FIG. 11 illustrates the preferred method of constructing a film bulk acoustic resonator according to the present invention.

Refer now to FIG. 11 which is a cross-sectional view of an FBAR 300 that is constructed over a silicon wafer 301 utilizing the preferred fabrication method. FBAR 300 is constructed as follows. First, a low temperature silicon oxide layer 302 is deposited on silicon substrate 301. Vias are then opened in layer 302 to provide paths to silicon substrate 301. The vias may be opened over pads having connections to the circuit elements that are to connect to the electrodes of the FBAR or over insulating regions on silicon substrate 301. Exemplary vaias are shown at 303 and 304. Via 303 is used to make connections to the bottom electrode, and via 304 is used to make connection to the top electrode. Additional vias are also opened at other locations to provide columns for supporting the final FBAR. The vias must be opened using a dry etch process that does not disturb the remainder of the low temperature silicon oxide layer 302. The vias should be located outside of the acoustical path.

Next, the vias are filled with metal. This is accomplished utilizing conventional deposition techniques, and hence, the metal deposition will not be discussed in more detail here. A metal layer 305 is then deposited over the low temperature silicon oxide layer and filled vias. Metal layer 305 is patterned to act as the bottom electrode and the heating layer of FBAR 300. If any of the filled vias are not to make contact with the bottom electrode, metal layer 305 is patterned to avoid the vias in question. Such an area is shown over via 304. Next, a layer of PZ material 306 is deposited over metal layer 305. PZ layer 306 is preferably AlN. Any vias that are needed for making connections to the top electrode of FBAR 300 are then opened and filled with metal. Such a filled via is shown at 307. The top electrode 308 is then deposited.

Finally, the low temperature oxide layer 302 is removed by a dilute liquid HF etch after providing protective coatings for areas that would be sensitive to the HF solution. This leaves FBAR 300 suspended over silicon substrate 301 on metal supports.

The above-described embodiments of the present invention utilize metal electrodes that are preferably constructed from molybdenum. The manner in which the Mo is deposited is important to the yield and function of the devices. If the Mo is deposited in a manner that leads to a stressed :metal layer, the stress may be sufficient to break the bond between the metal layer and, the layer on which it is deposited. Hence, in the preferred embodiment of the present invention, the conditions under which the Mo is deposited are adjusted to provide a low stress Mo layer.

The Mo is preferably deposited using sputtering. The parameters of the deposition such as pressure and gas flow rate determine the degree to which the resulting Mo layer is stressed. These parameters must be adjusted for the particular arrangement of the sputtering system. In the preferred embodiment of the present invention, the pressure in the chamber is used as the control variable. The stress in the Mo layer is measured as a function of the pressure. The pressure that generates the layer with the least stress is used in the depositions.

The stress in the Mo layer may be measured by depositing the layer on a silicon wafer and then determining the degree to which the deposited layer caused the silicon wafer to bow. For example, if the Mo layer is compressively stressed, the wafer will become convexly bowed. The degree of bowing may be determined by optical interference measurements. Such measurements are conventional in the art, and hence, will not be discussed in more detail here.

Similarly, it is important that the PZ layer also be deposited in a form which minimizes the stress in the layer. The procedure described above with reference to the Mo layer may also be used to determine the optimum conditions for depositing the PZ material.

While the above embodiments of the present invention have not shown a "caping" layer for protecting the top electrode, it will be apparent to those skilled in the art that such a layer may be desirable. It has been omitted from the drawings to simplify the drawings. If a caping layer is used, it becomes part of the acoustic path, and hence, must be taken into account in setting the thicknesses of the various components so as to arrive at a resonator having the proper resonance frequency.

Various modifications to the present invention will become apparent to those skilled in the art from the foregoing description and accompanying drawings. Accordingly, the present invention is to be limited solely by the scope of the following claims.

What is claimed is:

1. A method for fabricating an acoustical resonator comprising the steps of:

depositing a layer of $Si_3N_4$ on the top surface of a silicon substrate having top and bottom surfaces;

depositing a bottom electrode comprising a metallic layer on said $Si_3N_4$ layer;

depositing a PZ layer on said metallic layer;

depositing a top electrode comprising a metallic layer on said PZ layer;

etching said silicon substrate to remove the portion thereof between said bottom surface and a portion of said $Si_3N_4$, wherein either said bottom or said top metallic layer comprises a metal chosen from the group consisting of Mo, Ti, and W; and removing a portion of said silicon substrate from said bottom surface prior to depositing said bottom electrode.

2. A method for fabricating an acoustical resonator comprising the steps of:

depositing a layer of $Si_3N_4$ on the top surface of a silicon substrate having top and bottom surfaces;

depositing a bottom electrode comprising a metallic layer on said $Si_3N_4$ layer;

depositing a PZ layer on said metallic layer;

depositing a top electrode comprising a metallic layer on said PZ layer; and etching said silicon substrate to remove the portion thereof between said bottom surface and a portion of said $Si_3N_4$, wherein either said bottom of said top metallic layer comprises a metal chosen from the group consisting of Mo, Ti, and W;

wherein the deposition conditions for depositing one of said metallic layers are determined by measuring the deflection of a silicon substrate after a metallic layer is deposited thereon using said deposition conditions.

* * * * *